United States Patent
Hetzler (10) Patent No.: US 10,901,003 B2
(45) Date of Patent: Jan. 26, 2021

(54) CURRENT MEASURING DEVICE

(71) Applicant: Isabellenhuette Heusler GmbH & Co. KG, Dillenburg (DE)

(72) Inventor: Ullrich Hetzler, Dillenburg-Oberscheld (DE)

(73) Assignee: Isabellenhuette Heusler GmbH & Co. KG, Dillenburg (DE)

( * ) Notice: Subject to any disclaimer, the term of this patent is extended or adjusted under 35 U.S.C. 154(b) by 0 days.

(21) Appl. No.: 16/463,625

(22) PCT Filed: Nov. 3, 2017

(86) PCT No.: PCT/EP2017/078144
§ 371 (c)(1),
(2) Date: May 23, 2019

(87) PCT Pub. No.: WO2018/095709
PCT Pub. Date: May 31, 2018

(65) Prior Publication Data
US 2020/0182909 A1 Jun. 11, 2020

(30) Foreign Application Priority Data
Nov. 25, 2016 (DE) .................. 10 2016 014 130

(51) Int. Cl.
*G01R 1/20* (2006.01)
*G01R 1/44* (2006.01)
*G01R 19/32* (2006.01)

(52) U.S. Cl.
CPC ............. *G01R 1/203* (2013.01); *G01R 1/44* (2013.01); *G01R 19/32* (2013.01)

(58) Field of Classification Search
CPC .......... H01C 7/06; H01C 1/14; H01C 17/232; H01C 17/24; H01C 17/242; G01R 1/203; G01R 19/32; G01R 1/44
See application file for complete search history.

(56) References Cited

U.S. PATENT DOCUMENTS 6,489,693 B1 * 12/2002 Hetzler .............. G01R 19/0092
307/10.1
6,946,845 B2 9/2005 Hetzler
(Continued)

FOREIGN PATENT DOCUMENTS

| DE | 19906276 A1 | 9/2000 |
|---|---|---|
| EP | 0605800 A1 | 7/1994 |
| EP | 1363131 A1 | 11/2003 |

OTHER PUBLICATIONS

International Search Report for corresponding PCT/EP2017/078144 dated Feb. 15, 2018.

*Primary Examiner* — Kyung S Lee
(74) *Attorney, Agent, or Firm* — Caesar Rivise, PC (57) ABSTRACT

The invention concerns a current measuring device for measuring an electric current (Ip, In) according to the four-wire technology with a low resistance current measuring resistor (RCu1, RCu, R0). The invention also provides for a compensating resistor (Rp) consisting of a fixed resistor connected in parallel with the resistor element (R0) of the low-resistance current measuring resistor (RCu1, RCu, R0) in order to at least partially compensate for the temperature dependence of the resistance value, so that the current measuring device has two current paths, namely a main current path through the resistor element (R0) on the one hand and a secondary current path through the compensating resistor (Rp) on the other hand.

17 Claims, 4 Drawing Sheets

(56) References Cited

U.S. PATENT DOCUMENTS

| | | | |
|---|---|---|---|
| 9,237,653 B2* | 1/2016 | Kondou | G01R 1/203 |
| 9,377,491 B2* | 6/2016 | Sato | G01R 1/203 |
| 10,748,680 B2* | 8/2020 | Hetzler | H01C 7/06 |
| 2009/0087725 A1 | 4/2009 | Sim | |
| 2010/0201369 A1* | 8/2010 | Gronwald | H01C 1/14 |
| | | | 324/430 |
| 2012/0154104 A1* | 6/2012 | Hetzler | H01C 17/28 |
| | | | 338/49 |
| 2012/0268234 A1 | 10/2012 | Mikami | |
| 2013/0328547 A1* | 12/2013 | Marten | G01R 1/203 |
| | | | 324/126 |
| 2014/0015515 A1* | 1/2014 | Satou | G01R 31/364 |
| | | | 324/126 |
| 2015/0041200 A1* | 2/2015 | Hetzler | H05K 1/181 |
| | | | 174/260 |
| 2015/0192622 A1* | 7/2015 | Sato | G01R 1/203 |
| | | | 324/126 |
| 2016/0155547 A1 | 6/2016 | Yuan | |

* cited by examiner

Fig. 5A
Section A-A

Fig. 5B

Fig. 5C
Upper side

Fig. 5D
Under side

Fig. 6

CURRENT MEASURING DEVICE

CROSS REFERENCE TO RELATED APPLICATIONS

This application is the U.S. National Phase Application of PCT/EP2017/078144, filed Nov. 3, 2017, the contents of which is incorporated herein by reference in its entirety for all purposes.

BACKGROUND OF THE INVENTION

The invention concerns a current measuring device for measuring an electric current according to the four-wire technique.

Figure 1:
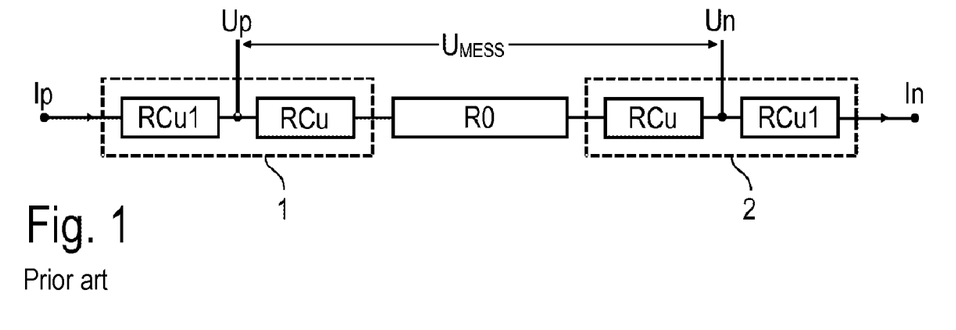
FIG. 1 shows a schematic representation (equivalent circuit diagram) of a conventional low-resistance current measuring resistor for current measurement according to the four-wire technology.

The measurement of an electric current according to the four-wire technique is known for example from EP 0 605 800 A1 and shown schematically in FIG. 1. FIG. 1 shows an equivalent circuit diagram of a low-resistance current measuring resistor with plate-shaped current connection parts 1, 2 made of a conductor material (e.g. copper) and a low-resistance resistor element R0 made of a resistor material (e.g. Manganin®) which is arranged in the current flow direction between the two current connection parts 1, 2. A current Ip to be measured is thus introduced via the current connection part 1 into the current measuring resistor and leaves the current measuring resistor again as current In via the current convection part 2. The electric current Ip or In to be measured therefore flows through the resistor element R0, so that the electric voltage falling across the resistor element R0 is a measure of the electric current Ip or In in accordance with Ohm's law. The measurement of the electric voltage falling across the resistor element R0 is carried out by two voltage measurement terminals Up, Un, which are connected to the current connection parts 1 or 2 near the contact point to the resistor element R0. However, it should be noted that not only the resistor element R0 but also resistors RCu in the current connection part 1 or in the current connection part 2 are located in the measuring loop of the two voltage measurement terminals Up, Un. The resistors RCu in the voltage measurement loop are undesirable and cannot be completely avoided. The current connection parts 1, 2 otherwise have a resistor RCu1 which is not in the voltage measuring loop and therefore does not falsify the measurement. The resistors RCu in the voltage measuring loop are problematic, because these resistors usually consist of copper or another well conducting contact material and therefore have a considerably higher temperature dependence than the resistor element R0. The temperature coefficient of the resistors RCu in the voltage measuring loop thus increases the temperature dependence of the current measurement according to the four-wire technique. This effect is particularly pronounced with extremely low-resistance resistors in the resistance range below one milli-Ohm.

SUMMARY OF THE INVENTION

The invention is therefore based on the task of reducing the temperature dependence of the current measurement in accordance with the four-wire technology.

This task is solved by a current measuring device according to the invention according to the main claim.

The invention provides that the electric current to be measured is not completely conducted through the resistor element. Instead, the electric current to be measured is divided into a main current path through the resistor element and a secondary current path through a compensating resistor (fixed resistor) which is electrically connected between the two voltage measurement terminals in parallel with the resistor element in order to at least partially compensate for the temperature dependence of the resistance value.

The current measuring device according to the invention partly corresponds with the known current measuring devices described at the beginning, as they are known from EP 0 605 800 A1, for example. For example, the current measuring device according to the invention first contains a low-resistance current measuring resistor with two current connection parts made of a conductor material (e.g. copper) for introducing or diverting the electric current to be measured and with a resistor element made of a resistor material (e.g. Manganin®), whereby the resistor element is arranged in the current flow direction between the first current connection part and the second current connection part. In addition, two voltage measurement terminals are provided, which are also made of a conductor material (e.g. copper) and have the task of measuring the electric voltage falling across the resistor element. The measured voltage then forms a measure of the current flowing through the resistor in accordance with Ohm's law.

The current measuring device according to the invention is now characterized by a compensating resistor connected in parallel to the resistor element, so that the electric current to be measured in the current measuring device is divided into the main current path through the resistor element of the current measuring resistor on the one hand and the secondary current path through the compensating resistor on the other hand.

In practice, there is at least one conductor element made of a conductor material (e.g. copper) in the secondary current path through the compensating resistor, which also has a resistance value with a certain temperature dependence and should be thermally coupled to the current measuring device. Due to the relatively high temperature coefficient of the resistance value of the conductor element in the secondary current path, the resistance value in the secondary current path increases with increasing temperature. As a result, the current in the secondary current path and thus also the voltage drop across the resistor element decreases, i.e. has a negative temperature coefficient. The resistances of the conductor element in the secondary current path on the one hand and of the resistor element on the other hand can now be dimensioned in such a way that the positive temperature coefficient of the resistance value in the main current path can be compensated. Ideally, the temperature dependence of the measurement can be almost completely compensated.

In a preferred embodiment of the invention, the compensating resistor and the resistor element are made of the same resistor material (e.g. Manganin®). Within the scope of the invention, however, there is also the possibility that the compensating resistor on the one hand and the resistor element of the current measuring resistor on the other hand consist of different resistor materials, which then only requires a correspondingly adapted dimensioning of the resistance values.

It should also be mentioned that the two current connection parts of the current measuring resistor on the one hand and the conductor elements in the secondary current path on the other hand preferably consist of the same conductor material (e.g. copper). However, within the scope of the invention there is also the possibility that the current connection parts on the one hand and the conductor elements in the secondary current path on the other hand consist of different conductor materials, which then only requires a correspondingly adapted dimensioning of the resistance values in order to achieve the desired compensation of the temperature dependency.

The invention comprises two fundamentally different variants, namely a first variant with a carrier substrate (e.g. ceramic) and a second variant with a printed circuit board on the current measuring resistor.

In the first variant of the invention with the carrier substrate, the low-resistance current measuring resistor is mounted on the carrier substrate. Furthermore, in this version of the invention, the compensating resistor is also preferably mounted on the carrier substrate. Furthermore, in this variant of the invention, the carrier substrate also carries the external current connection parts and the voltage measurement terminals.

It should be mentioned here that the carrier substrate is preferably plate-shaped and—as mentioned briefly above—can be made of ceramic. For example, the carrier substrate may be a Direct Copper Bonded (DCB) substrate, whereby such DCB substrates are known from the state of the art and therefore do not need to be described in more detail. There is also the possibility that the carrier substrate may be a punched grid of a conductor material.

It should also be mentioned that the resistor element of the low resistance current measuring resistor in this variant of the finding can be an SMD resistor (SMD: Surface Mounted Device), which contacts the current connection parts on the carrier substrate.

The carrier substrate can also carry two pads (soldering surfaces) for mounting and electrically contacting the compensating resistor. The compensating resistor can also be designed as an SMD resistor and then soldered onto the two pads on the carrier substrate.

Preferably, the two pads for the compensating resistor are arranged on the side of the current connection parts with respect to the main current direction in the current measuring resistor.

The connection between the pads for the compensating resistor on the one hand and the current connection parts of the current measuring resistor on the carrier substrate on the other hand is preferably made by conductor tracks which consist of a conductor material (e.g. copper) and then compensate the temperature dependency of the current measurement with their temperature dependency, as already briefly explained above.

These conductor tracks preferably contact the current connection parts at the transition to the resistor element, i.e. as close as possible to the resistor element, in order to achieve a good thermal coupling and thus minimize the copper influence on the temperature dependence.

In addition, it should be mentioned that the conductor tracks contact the two current connection parts of the current measuring resistor preferably on opposite sides with respect to the main current direction in the current measuring resistor. So one track can be led from the side directly to one current connection part, while the other track is led through a gap between the two current connection parts to the opposite side to contact the other current connection part. Other conductor tracks, e.g. both conductor tracks between the current connection points, are also possible.

The two conductor tracks mentioned above then preferably form the conductor elements in the secondary current path, which contribute to the compensation of the temperature dependence of the measurement.

In addition, the pads (soldering surfaces) for the compensating resistor can be connected to the voltage measurement terminals via further conductor tracks on the carrier substrate.

The first variant of the invention described above allows a current supply or current dissipation via the carrier substrate.

In this first variant of the invention, the carrier substrate can also carry other active and/or passive components or assemblies, such as an electronic circuit for measuring the voltage drop across the voltage measurement terminals. For example, this electronic circuit can be designed as an application-specific integrated circuit (ASIC), as is known from EP 1 363 131 A1 and DE 199 06 276 A1.

In the second variant of the invention, on the other hand, the current measuring device has a printed circuit board that is mounted on the current measuring resistor and connected to the current measuring resistor. The printed circuit board is preferably smaller than the current measuring resistor, so that the printed circuit board and the current measuring resistor form a structural unit. The printed circuit board carries the two voltage measurement terminals Up, Un.

In this variant of the invention, the compensating resistor is preferably mounted on the printed circuit board, especially on the upper side of the printed circuit board facing away from the current measuring resistor. The printed circuit board thus carries the compensating resistor on its upper side and is connected to the current measuring resistor on its lower side.

This connection between the printed circuit board and the current measuring resistor is preferably made by two solder pads which are mounted on the underside of the printed circuit board and which are electrically connected to the current connection parts of the low resistance current measuring device, for example by a solder connection. Other connections, e.g. sintering, bonding or galvanic copper plating, are also possible.

In addition, the printed circuit board then preferably also carries at least one conductor element in the secondary current path, especially on the top side of the printed circuit board or in an intermediate layer of the multilayer printed circuit board.

The printed circuit board contains an integrated compensating resistor or preferably has pads (soldering surfaces) on its top side for mounting and contacting the compensating resistor. The compensating resistor can therefore be designed as an SMD resistor and soldered to the pads on the top of the printed circuit board.

It has already been mentioned above that the current measuring resistor on the one hand and the compensating resistor on the other hand are preferably arranged on opposite sides of the printed circuit board. The printed circuit board therefore preferably has through-connections to connect the solder pads on the underside of the printed circuit board to the compensating resistor pads on the top side of the printed circuit board.

It should also be mentioned that the printed circuit board preferably also comprises the voltage measurement terminals on its top side.

Furthermore, on the upper side of the printed circuit board or on an inner layer of the printed circuit board there can be at least one conductor track which connects one of the pads for the compensating resistor to one of the through-connections and also forms the conductor element in the secondary current path which contributes to the compensation of the temperature-dependent current measurement.

In a further modification of this variant of the invention, two pads (soldering surfaces) for contacting a temperature-dependent resistor (e.g. Pt100 resistor or Ni100 resistor) are located on the upper side of the printed circuit board, this temperature-dependent resistor being connected in series with one of the two voltage measurement terminals and together with the latter forming the conductor element in the secondary current path.

For example, the printed circuit board can be a multi-layer glass fibre or a flexible printed circuit board.

In addition, this variant of the invention also offers the possibility that the printed circuit board also carries a power semiconductor or other active or passive components or assemblies, such as the above-mentioned electronic circuit (e.g. ASIC) for measuring the voltage drop across the voltage measurement terminals.

In the latter mentioned second variant of the invention with a printed circuit board, the electric current to be measured is usually fed directly into the current measuring resistor via a cable, a busbar or a solder connection and then diverted from it again, i.e. not via the printed circuit board.

In the preferred embodiment of the invention, the current measuring resistor has a resistance value in the range from 1µΩ to 1 mΩ. The resistance value of the current measuring resistor is therefore preferably greater than 1µΩ, 5µΩ, 10µΩ, 30µΩ and/or smaller than 10 mΩ, 5 mΩ, 2.5 mΩ, 1 mΩ, 500µΩ, 250µΩ, or even smaller than 100µΩ.

It should also be mentioned that the current measuring resistor according to the invention preferably has a current carrying capacity of at least 1A, 2A, 3A, 10A, 30A or even at least 100A.

The length of the current measuring resistor in the main current flow direction is preferably at most 20 mm, 5 mm, 2 mm, 1.5 mm or 1 mm.

The thickness of the measuring resistor is preferably less than 5 mm, 3 mm, 2 mm, 1.5 mm, 1 mm, 0.5 mm or 0.2 mm.

Crosswise to the direction of current flow, however, the width of current measuring resistor is preferably not more than 200 mm, 50 mm, 10 mm, 5 mm or 1 mm.

The resistance value of the current measuring resistor preferably has a temperature coefficient of maximum 500 ppm/K, 200 ppm/K, 100 ppm/K, 30 ppm/K or maximum 10 ppm/K.

It has already been mentioned above that the conductor material is preferably copper. However, it is also possible that other conductor materials such as aluminium, nickel, tin, silver, gold or conductive alloys of these elements may be used in the invention.

However, the conductor material should have a lower specific electric resistance than the resistor material of the resistor element.

The two current connection parts are preferably welded to the resistor element, for example by electron beam welding, as is known from EP 0 605 800 A1, for example.

The resistor element itself can also be made of a roll clad copper-based resistor material.

The current connection parts of the current measuring resistor can also be produced by galvanic copper plating.

With regard to the resistor material of the resistor element, it should be noted that a copper-manganese-nickel alloy is preferably used, such as Cu86Mn12Ni2. The invention, however, is not limited to this alloy with regard to the resistor material, but can also be realized with other resistor materials that do not resist.

It should also be mentioned that the current connection parts and the resistor element are preferably plate-shaped, whereby both a flat and a curved design are possible.

It has already been mentioned at the beginning that the compensating resistor, with a suitable measurement of its resistance value, leads to the fact that the temperature dependence of the current measurement is largely or almost completely compensated. The prerequisite for this is that the resistance value of the compensating resistor is appropriately dimensioned. The compensating resistor therefore preferably has a resistance value Rp, which is calculated according to the following approximation formula:

$$Rp'=RCupg \cdot TKCu/TK$$

with:
Rp: Resistance value of the compensating resistor,
RCupg: sum of the resistance values of the conductor loops in the secondary current path,
TKCu: temperature coefficient of the resistance value of the conductor material of the conductor loops in the secondary current path (usually copper),
TK: temperature coefficient of the current measuring resistor without the compensating resistor.

However, the resistance value of the compensating resistor does not have to be calculated mathematically exactly according to this formula. Rather, the resistance value can also have a tolerance of up to ±30%, ±20%, +10%, +5%, +2% or +1% compared to the above calculation formula, which leads to a more or less good compensation of the temperature dependency.

BRIEF DESCRIPTION OF SEVERAL VIEWS OF THE DRAWINGS

Other advantageous further modifications of the invention are indicated in the dependent claims or are explained in more detail below together with the description of the preferred embodiments of the invention on the basis of the figures. They show:

FIG. 3 shows a view of a current measuring device according to the invention on a carrier substrate, FIG. 4 a diagram to illustrate the improvement of the temperature dependence of a 70 µOhm SMD resistor on DCB with compensating resistor compared to the measurement without the compensating resistor, FIG. 5A a sectional view along the section line A-A in FIG. 5B of a current measuring device according to the invention with a low resistance current measuring resistor and a printed circuit board mounted on it, FIG. 5B a complete view of the printed circuit board according to FIG. 5A, FIG. 5C a top view of the printed circuit board according to FIG. 5A, FIG. 5D a bottom view of the printed circuit board according to FIG. 5A, and FIG. 6 a diagram to illustrate the improvement of the temperature dependence of a 30 µOhm resistor made of composite material with soldered on printed circuit board with the compensating resistor in comparison to the measurement without the compensating resistor.

DETAILED DESCRIPTION OF PREFERRED EMBODIMENTS

Figure 2:
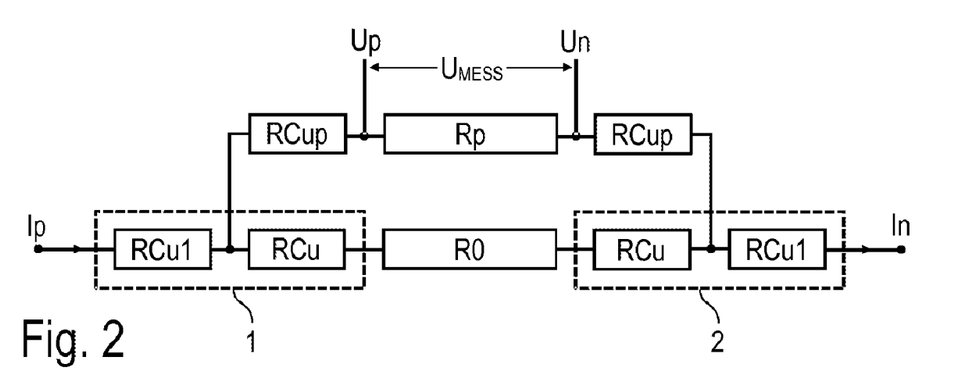
FIG. 2 shows an equivalent circuit diagram of a current measuring device according to the invention with a low resistance current measuring resistor and a secondary current circuit with an additional compensating resistor for compensation of the temperature dependency.

In the following, the equivalent circuit diagram of the current measuring device according to the invention shown in FIG. 2 is described.

This current measuring device according to the invention first has a conventional current measuring resistor, as already described at the beginning and shown in FIG. 1. In order to avoid repetitions, therefore, reference is largely made to the description of FIG. 1, where the same reference signs are used for corresponding details.

A special feature of the current measuring device according to the invention is that the electric current Ip or In to be measured is divided into a main current path through the resistor element R0 and a secondary current path through a compensating resistor Rp.

In the secondary current path through the compensating resistor Rp there are also further conductor elements with a resistor RCup arranged, as will be explained in detail with regard to the different variants of the invention. The resistors RCup in the secondary current path are usually made of copper and have a relatively high temperature coefficient and a correspondingly high temperature dependence of the resistance value. As the temperature rises, the resistance value in the secondary current path increases due to the compensating resistor Rp, so that the current in the secondary current path and thus also the voltage drop $U_{MESS}$ across the compensating resistor Rp decreases, i.e. has a negative temperature coefficient. The resistance values of the resistors RCup and Rp are now dimensioned in such a way that the influence of the resistors RCu on the temperature dependence in the main current path is completely compensated as far as possible.

For this purpose, the resistance value of the compensating resistor Rp is dimensioned as follows:

$$Rp = RCupg \cdot TKCu/TK$$

with:
Rp: Resistance value of the compensating resistor,
RCupg: Sum of the resistance values of the conductor loops in the secondary current path,
TKCu: Temperature coefficient of the resistance value of the conductor material, usually copper,
TK: Temperature coefficient of the current measuring resistor without the compensating resistor Rp.

Figure 3:
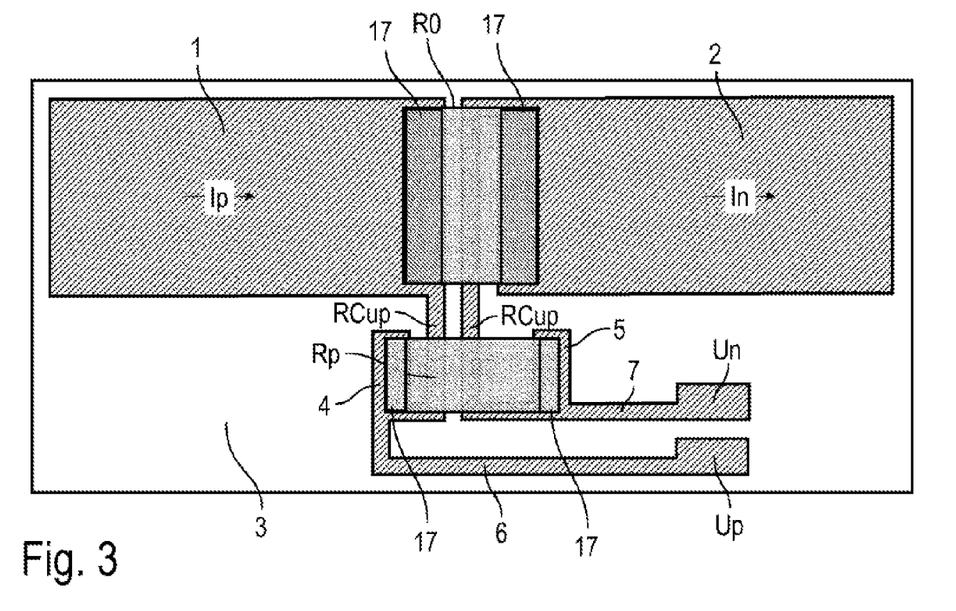

FIG. 3 shows an overview of a first variant of the current measuring device according to the invention, with reference to the above description of FIG. 2 for an explanation of the technical mode of operation.

In this variant of the invention a plate-shaped carrier substrate 3 is provided, which consists of ceramic and carries the two current connection parts 1, 2 on its upper side.

The introduction or diversion of the electric current thus takes place on the carrier substrate 3, which may contain further active and/or passive electronic components for this purpose, but which are not shown here for simplification.

The low-resistance resistor element R0 of the current measuring resistor is designed as an SMD resistor and applied to the two current connection parts 1, 2, for example by means of a solder pad 17.

On the side next to the two current connection parts 1, 2 there are two pads 4, 5 (solder surfaces) for mounting and electric contacting of the compensating resistor Rp, which is also designed as an SMD resistor and can be soldered onto the two pads 4, 5 (solder pad 17).

The two pads 4, 5 are connected to the two current connection parts 1, 2 by conductor tracks RCup, whereby the two conductor tracks RCup can have different resistance values, lie in the secondary current path and contribute with the temperature dependency of their resistance value to the compensation of the temperature dependency of the current measurement.

In addition, the two pads 4, 5 for the compensating resistor Rp are connected to the voltage measurement terminals Un, Up via additional conductor tracks 6, 7.

Figure 4:
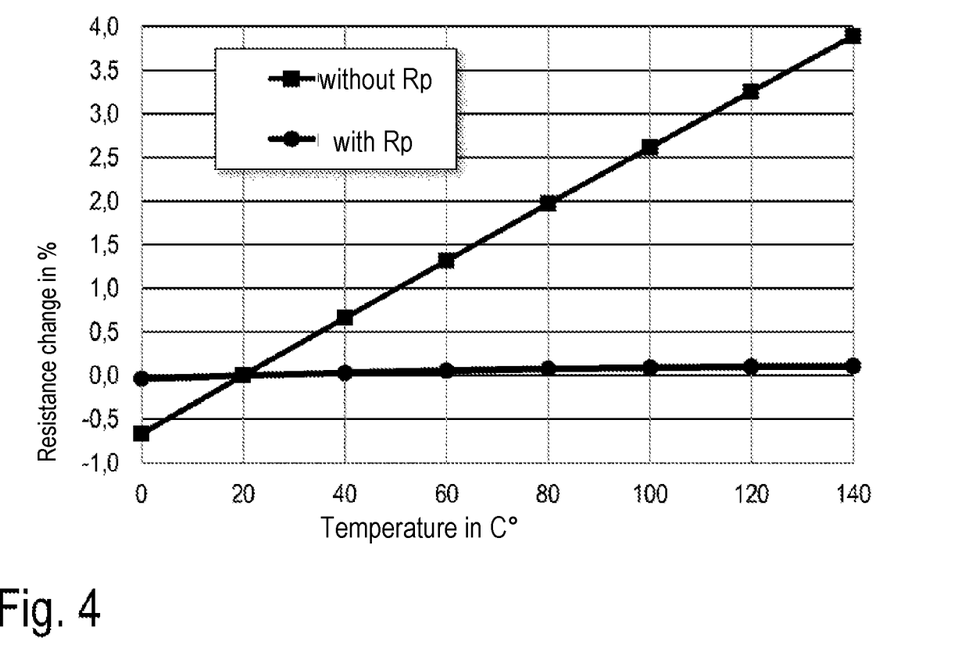

FIG. 4 shows a diagram illustrating the temperature-dependent relative change in resistance of the current measuring arrangement with the compensating resistor Rp and for comparison without the compensating resistor Rp. From this it can be seen that the compensating resistor Rp leads to an extremely large reduction of the temperature dependence.

FIGS. 5A-5D show different views of a further embodiment of a current measuring device according to the invention.

This embodiment also comprises a low-resistance current measuring resistor with the two current connection parts 1, 2 and the low-resistance resistor element R0, where the low-resistance current measuring resistor is plate-shaped, as known for example from EP 0 605 800 A1.

Figure 5A:
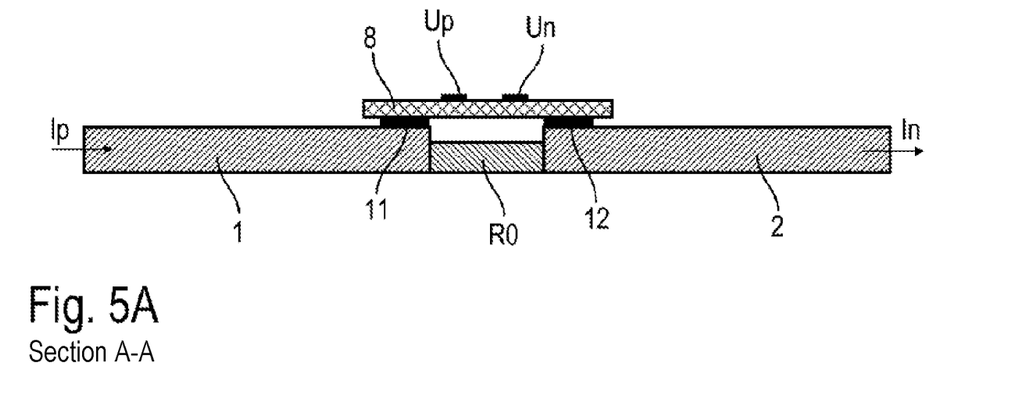
Figure 5B:
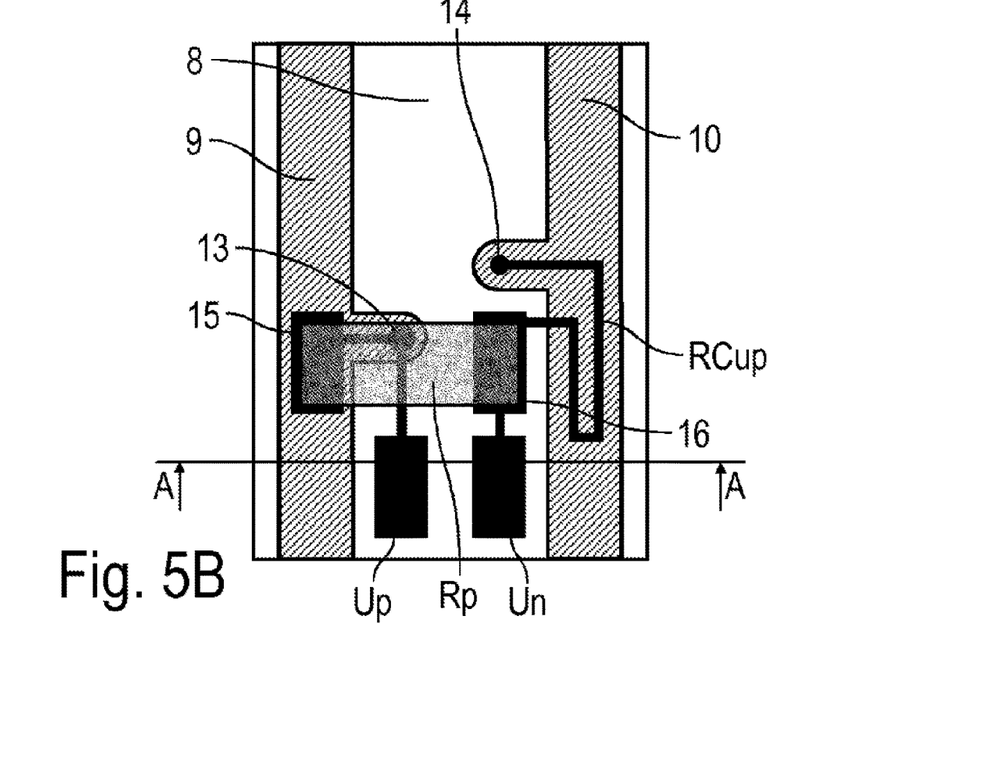
Figure 5C:
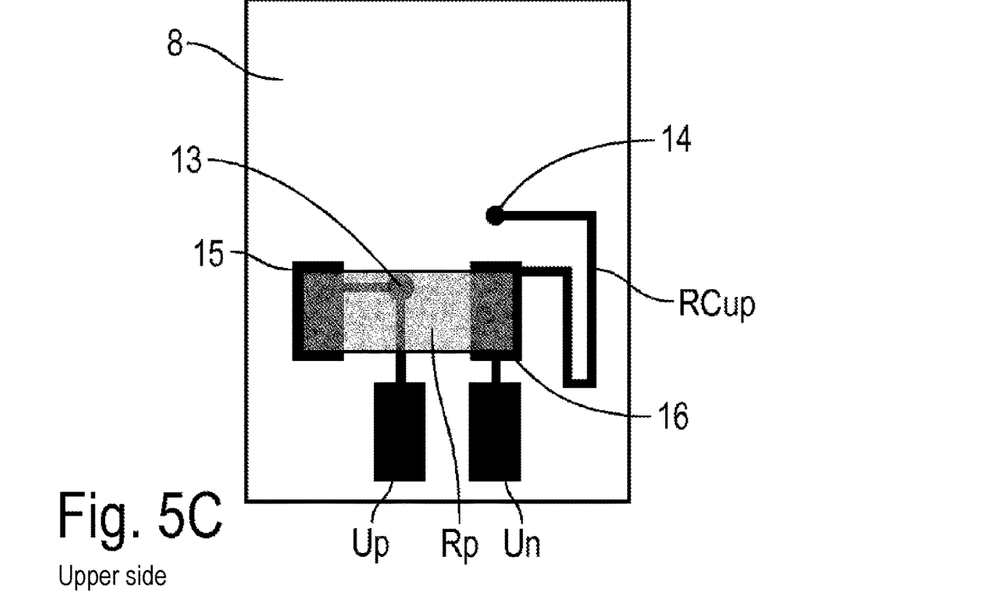

A printed circuit board 8 is arranged on the upper side of the low-resistance current measuring resistor, which carries the compensating resistor Rp on its upper side, as shown in FIGS. 5B and 5C.

Figure 5D:
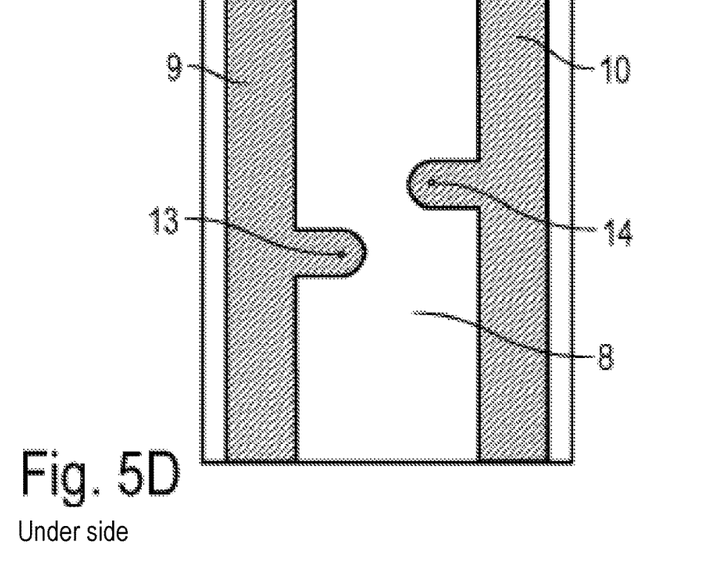

On its underside, the printed circuit board 8 carries solder pads 9, 10 for electric contacting on the current connection parts 1 or 2 of the low-resistance current measuring resistor. For this purpose the solder pads 9, 10 on the underside of the printed circuit board 8 can be connected by solder connections 11 or 12 to the current connection parts 1 or 2 of the low resistance current measuring resistor, as shown in FIG. 5A.

In addition, the printed circuit board 8 has electric through-connections 13, 14 to connect the solder pads 9, 10 at the bottom of the printed circuit board 8 to the compensating resistor Rp at the top of the printed circuit board 8.

The compensating resistor Rp is connected to solder pads 15, 16 on the upper side of the printed circuit board 8.

The through-connection 13 connects the solder pad 15 for the compensating resistor Rp with the solder pad 9 on the underside of the printed circuit board 8.

The through-connection 14, on the other hand, is connected to the solder pad 16 for the compensating resistor Rp via a conductor track RCup. The conductor track RCup contributes with the temperature dependence of its resistance value to the compensation of the temperature dependence of the measurement, as already described above with reference to FIG. 2.

Figure 6:
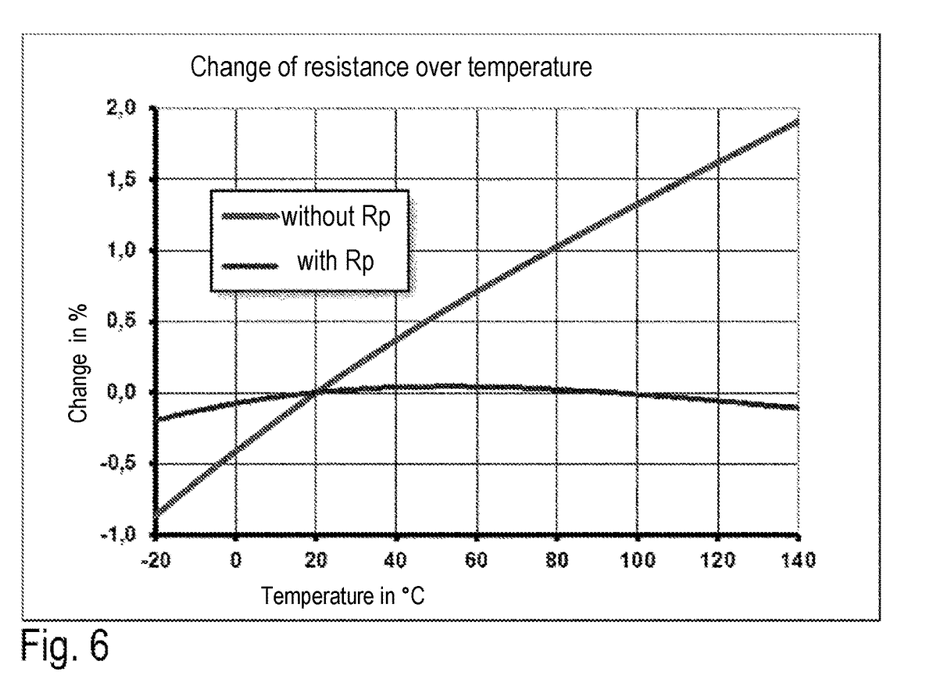

Finally, FIG. 6 shows a diagram of a measurement at a 30 μOhm resistor made of composite material with a soldered printed circuit board. The diagram shows the relative change of the resistance value of the current measuring arrangement as a function of the temperature, on the one hand without the compensating resistance Rp and for comparison with the compensating resistance Rp. From this it can be seen that even in this variant of the invention the temperature dependence is greatly reduced.

The invention is not limited to the preferred embodiments described above. Rather, a large number of variants and modifications are possible which also make use of the invention idea and therefore fall within the scope of protection. In particular, the invention also claims protection for the object and the features of the dependent claims independently of the features of the respective claims referred to and in particular also without the features of the main claim.

LIST OF REFERENCE SIGNS

Ip Current which is fed into the current measuring device
In Current discharged from the current measuring device
R0 Resistor element of the current measuring resistor
RCu Cu resistor in the current connection parts between the resistor element and the voltage taps
RCu1 Cu resistance of the current connection parts outside the voltage terminals
Rp Compensating resistor
RCup Resistance of the conductor path in the secondary current path
Up, Un Voltage measurement terminals
$U_{Mess}$ Measured voltage drop across the voltage measurement terminals
1, 2 Current connection parts
3 Carrier substrate
4, 5 Pads for the compensating resistor
6, 7 Conductor tracks to connect the voltage measurement terminals to the pads of the compensating resistor
8 Printed circuit board
9, 10 Solder pads on the underside of the printed circuit board for its contacting on the current connection parts of the current measuring resistor
11, 12 Solder connections
13, 14 Through-connections in the printed circuit board
15, 16 Solder pads for the compensating resistor on the soldering plate
17 Solder pad for contacting the resistors on the substrate

The invention claimed is:

1. Current measuring device for measuring an electric current according to a four-wire technique, comprising:
   a) a current measuring resistor with
      a1) a first current connection part made of a conductor material for introducing the current into the current measuring resistor,
      a2) a second current connection part made of a conductor material for discharging the current from the current measuring resistor,
      a3) a resistor element made of a resistor material, the resistor element being arranged in the current flow direction between the first current connection part and the second current connection part,
      a4) a first voltage measurement terminal made of a conductor material for measuring an electric voltage dropping across the resistor element, and
      a5) a second voltage measurement terminal made of a conductor material for measuring the electric voltage dropping across the resistor element, and
   b) a compensating resistor including a fixed resistor which is electrically connected between the two voltage measurement terminals in parallel with the resistor element in order to at least partially compensate for the temperature dependence of the resistance value, so that the current measuring device has two current paths, namely a main current path through the resistor element on the one hand and a secondary current path through the compensating resistor on the other hand, wherein
   c) a printed circuit board is mounted on the current measuring resistor and is electrically connected to the current measuring resistor,
   d) the compensating resistor is mounted on the printed circuit board,
   e) the printed circuit board contains the compensating resistor intergrated or has pads on its upper side for mounting and contacting the compensating resistor,
   f) the printed circuit hoard has through-connections in order to connect the solder pads on the underside of the printed circuit board to the pads for the compensating resistor on the upper side of the printed circuit board,
   g) the voltage measuring terminals are arranged on the upper side of the printed circuit board, and
   h) at least one conductor track is arranged on the upper side of the printed circuit board or on one of the inner layers of the printed circuit board, which track connects one of the pads for the compensating resistor to one of the through-connections and forms the conductor element in the secondary current path.

2. Current measuring device according to claim 1, wherein at least one conductor element made of a conductor material, which also has a resistance value with a specific temperature dependence and is thermally coupled to the current measuring device, is also arranged in the secondary current path through the compensating resistor.

3. Current measuring device according to claim 2, wherein
   a) the compensating resistor and the resistor element consist of the same resistor material, and
   b) the two current connection parts and the two conductor elements in the secondary current path consist of the same conductor material.

4. Current measuring device in accordance with claim 1, wherein
   a) the current measuring device comprises a carrier substrate,
   b) the current measuring resistor is mounted on the carrier substrate,
   c) the compensating resistor is mounted on the carrier substrate,
   d) the carrier substrate carries the current connection parts, and
   e) the carrier substrate carries the voltage measurement terminals.

5. Current measuring device according to claim 4, wherein the carrier substrate is plate-shaped.

6. Current measuring device according to claim 4, wherein the carrier substrate is formed of ceramic.

7. Current measuring device according to claim 4, wherein the carrier substrate is formed as a direct copper-bonded substrate.

8. Current measuring device according to claim 4, wherein the carrier substrate is formed as a punched grid made of a conductor material.

9. Current measuring device according to claim 4, wherein the resistor element of the current measuring resistor is a Surface Mounted Device (SMD) resistor which contacts the current connection parts on the carrier substrate.

10. Current measuring device according to claim 4, wherein
    a) the carrier substrate carries two pads for mounting and electrically contacting the compensating resistor,
    b) the two pads for the compensating resistor are arranged laterally next to the current connection parts in the current measuring resistor with respect to the main current direction, c) the two pads for the compensating resistor are connected via conductor tracks on the carrier substrate to the current connection parts, and
d) the conductor tracks on the carrier substrate contact the current connection parts in each case at a transition to the resistor element.

11. Current measuring device according to claim 10, wherein
a) the conductor tracks on the carrier substrate contact the two current connection parts with respect to the main current direction in the current measuring resistor on opposite sides,
b) the conductor tracks form the conductive elements in the secondary current path,
c) the conductor tracks are thermally coupled to the resistor, and
d) the pads for the compensating resistor are connected to the voltage measurement terminals via further conductor tracks on the carrier substrate.

12. Current measuring device in accordance with claim 1, wherein
a) the printed circuit board for contacting the two current connection parts of the current measuring resistor carries two solder pads made of a conductor material, namely on the underside facing the current measuring resistor,
b) the at least one conductor element of the secondary current path is arranged on the printed circuit board, and
c) the conductor element is arranged above a solder pad in order to improve the thermal coupling.

13. Current measuring device according to claim 1, wherein two pads for contacting a temperature-dependent resistor are arranged on the upper side of the printed circuit board and this temperature-dependent resistor is connected in series with one of the two voltage measurement terminals and together with these forms the conductor element in the secondary current path.

14. Current measuring device according to claim 13, wherein the temperature-dependent resistor is one of a Pt100 resistor and a Ni100 resistor.

15. Current measuring device according to claim 1, wherein
a) the printed circuit board is a multilayer glass fiber board or a flexible printed circuit board, and
b) the printed circuit board also carries at least one of a power semiconductor and further active and passive components.

16. Current measuring device for measuring an electric current according to a four-wire technique, comprising:
a) a current measuring resistor with
a1) a first current connection part made of a conductor material for introducing the current into the current measuring resistor,
a2) a second current connection part made of a conductor material for discharging the current from the current measuring resistor,
a3) a resistor element made of a resistor material, the resistor element being arranged in the current flow direction between the first current connection part and the second current connection part,
a4) a first voltage measurement terminal made of a conductor material for measuring an electric voltage dropping across the resistor element,
a5) a second voltage measurement terminal made of a conductor material for measuring the electric voltage dropping across the resistor element; and
b) a compensating resistor including a fixed resistor which is electrically connected between the two voltage measurement terminals in parallel with the resistor element in order to at least partially compensate for the temperature dependence of the resistance value, so that the current measuring device has two current paths, namely a main current path through the resistor element on the one hand and a secondary current path through the compensating resistor on the other hand, wherein
c) the current measuring resistor has a resistance value of at least 1 µΩ and at most 10 mΩ,
d) the current measuring resistor has a current carrying capacity of at least 1A,
e) the current measuring resistor has a length in the main current flow direction of not more than 20 mm,
f) the current measuring resistor has a thickness of at most 5 mm,
g) the current measuring resistor has a width transverse to the main flow direction not exceeding 200 mm,
h) the current measuring resistor has a resistance value with a temperature coefficient not exceeding 500 ppm/K,
i) the conductor material is one of copper and a copper alloy,
j) the conductor material has a lower resistivity than the resistor material,
k) the two current connection parts are welded to the resistor element,
l) the resistor material is a copper-manganese-nickel alloy,
m) the two current connection parts are plate-shaped,
n) the resistor element is plate-shaped.

17. Current measuring device for measuring an electric current according to a four-wire technique, comprising:
a) a current measuring resistor with
a1) a first current connection part made of a conductor material for introducing the current into the current measuring resistor,
a2) a second current connection part made of a conductor material for discharging the current from the current measuring resistor,
a3) a resistor element made of a resistor material, the resistor element being arranged in the current flow direction between the first current connection part and the second current connection part,
a4) a first voltage measurement terminal made of a conductor material for measuring an electric voltage dropping across the resistor element,
a5) a second voltage measurement terminal made of a conductor material for measuring the electric voltage dropping across the resistor element, and
b) a compensating resistor including a fixed resistor which is electrically connected between the two voltan measurement terminals in parallel with the resistor element in order to at least partially compensate for the temperature dependence of the resistance value, so that the current measuring device has two current paths, namely a main current path through the resistor element on the one hand and a secondary current path through the compensating resistor on the other hand, wherein the compensating resistor has a resistance value Rp which is calculated according to the following approximation formula:

$$R_p = R_{Cupg} \cdot TK_{cu}/TK$$

with:
Rp: Resistance value of the compensating resistor,
RCupg: Sum of the resistance values of the conductor loops in the secondary current path,
TKCu: Temperature coefficient of the resistance value of the conductor material, preferably copper,
TK: Temperature coefficient of the current measuring resistor without the compensating resistor,
and with a tolerance of less than ±30%.

\* \* \* \* \*